United States Patent
Ueda et al.

(10) Patent No.: US 6,432,614 B1
(45) Date of Patent: Aug. 13, 2002

(54) PHOTOSENSITIVE RESIN COMPOSITION AND COLOR FILTER

(75) Inventors: Kenji Ueda; Satoshi Shioda; Hirotaka Nishijima, all of Shinjuku-Ku; Tomoaki Mukaiyama; Syuichi Mitsuhashi, both of Yokohama, all of (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/363,752

(22) Filed: Jul. 30, 1999

(30) Foreign Application Priority Data

Jul. 31, 1998 (JP) ............................................ 10-216868

(51) Int. Cl.$^7$ ............................................... G03F 7/027
(52) U.S. Cl. ................................ 430/281.1; 430/280.1; 430/287.1; 430/927
(58) Field of Search ........................... 430/281.1, 287.1, 430/927, 280.1

(56) References Cited

U.S. PATENT DOCUMENTS

| | | | |
|---|---|---|---|
| 3,928,299 A | 12/1975 | Rosenkranz et al. | 260/89.5 N |
| 4,717,643 A | 1/1988 | Scheve et al. | 430/284 |
| 5,925,499 A * | 7/1999 | Hernandez et al. | 430/280.1 |
| 5,942,369 A * | 8/1999 | Ota et al. | 430/192 |

FOREIGN PATENT DOCUMENTS

| | | |
|---|---|---|
| FR | 2134645 | 12/1972 |
| WO | WO 95/00573 | 1/1995 |

* cited by examiner

Primary Examiner—Rosemary Ashton
(74) Attorney, Agent, or Firm—Parkhurst & Wendel, L.L.P

(57) ABSTRACT

There is provided a photosensitive resin composition comprising: a copolymer resin; a bifunctional or higher polyfunctional photopolymerizable acrylate monomer; an epoxy resin; and an initiator, the copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, the copolymer resin containing 5 to 95% by mole of (meth)acryloyl groups and having an acid value of 5 to 400 mg KOH/g and a weight average molecular weight of 10,000 to 1,000,000 as determined using polystyrene as a standard:

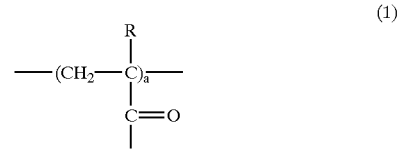

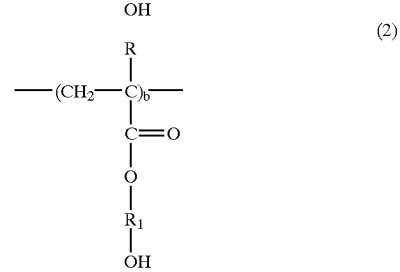

wherein R represents hydrogen or an alkyl group having 1 to 5 carbon atoms and $R_1$ represents an alkylene group having 2 to 4 carbon atoms.

2 Claims, 1 Drawing Sheet

PHOTOSENSITIVE RESIN COMPOSITION AND COLOR FILTER

BACKGROUND OF THE INVENTION

1. Field of the Invention

The present invention relates to a photosensitive resin composition and a color filter provided with a protective layer formed of the photosensitive resin composition, and more particularly to a color filter which can realize color liquid-crystal displays having excellent display quality and high reliability.

2. Background Art

In recent years, color liquid-crystal displays have drawn attention as flat displays. They generally have a structure comprising: a color filter; a counter electrode substrate facing the color filter; and a liquid-crystal layer provided in a gap (1 to 10 μm) between the color filter and the counter electrode substrate. The structure of the color filter is such that a colored layer of a black matrix and a plurality of colors (generally three primary colors, red (R), green (G), and blue (B)) or, in recent years, a color hologram is provided on a transparent substrate and a protective layer and a transparent electrode are stacked thereon in that order. These color liquid-crystal displays are constructed so that a color image is obtained by controlling the light transmission of the liquid-crystal layer in its portions corresponding to pixels of respective colored layers R, G, and B or a color hologram.

In the color filter, the protective layer, when the color filter comprises the colored layer, functions to protect and flatten the color filter. In general, color liquid-crystal displays have a problem that the presence of uneven gap attributable to the waviness of the surface of the transparent substrate in the color filter, uneven gap among R, G, and B pixels, or uneven gap within pixels of R, G, and B lowers the flatness of the transparent electrode. This causes uneven colors and uneven contrast, leading to lowered image quality. In particular, in color liquid crystal displays of STN (super-twisted nematic) system, the flatness greatly affects the image quality. This renders flattening by the protective layer very important.

In use, the color filter is adhered to the counter electrode. The assembly is then tested for display quality. In consideration of reutilizability of the color filter when the assembly is judged to be unacceptable in the display quality test, the protective layer is preferably provided only in specific regions so as to cover the colored layers on the transparent substrate. To this end, the protective layer has been formed using a photocurable resin which permits portions to be cured to be easily limited through a mask.

In the formation of the protective layer using the conventional resin, an organic solvent is used in the development after exposure. This is troublesome in handleability and wastewater treatment and further lacks in profitability and stability. In order to solve this problem, a photocurable resin has been developed which, by virtue of the introduction of an acidic group into the photocurable resin, permits alkali development after the exposure. An example of the alkali-soluble photocurable resin known in the art is o-cresol novolak epoxyacrylate having a weight average molecular weight of about 2,000. This has as monomer units carboxylic acid groups governing alkali solubility and acryloyl groups governing curability. Therefore, the proportions of the carboxylic acid group and the acryloyl group in the resin is constant.

For this reason, introduction of a large amount of an acryloyl-modified, low-molecular weight polyfunctional alcohol, for example, a hexafunctional alcohol, dipentaerythritol hexaacrylate (DPHA), is considered effective for improving the density of the radical polymerizable group in the photosensitive resin composition. This method, however, results in excessively lowered viscosity of the photosensitive resin composition, posing a problem that the coatability is deteriorated. Further, this involves an additional problem that, when the photosensitive resin composition is coated for the formation of the protective layer in the color filter, cracks are created in the coating due to remarkable shrinkage upon curing and the adhesion of the protective layer is poor.

Typical conventional methods for introducing radically reactive groups, such as (meth)acryloyl groups, include, for example, regarding the preparation of urethane acrylate, a method which comprises reacting a diol compound with a diisocyanate in an excessive amount to give a product with the isocyanate group being left at the ends and reacting this isocyanate group with 2-hydroxyethyl methacrylate to introduce a radically polymerizable group, such as a methacryloyl group, into the ends of the reaction product. In this method, in principle, the methacryloyl group is introduced into only both ends. Incorporation of a compound having two or more (meth)acryloyl groups as a part of the system followed by radical polymerization is also considered. According to this method, however, the content of the radically reactive group cannot be regulated. Further, this method involves a problem of gelation and the like.

Thus, for the photocurable resins, it is difficult to regulate alkali-soluble groups, such as carboxyl groups, and radically polymerizable groups, such as (meth)acryloyl groups, for attaining desired curability, alkali solubility and the like. Further, photosensitive resin compositions having not only excellent curability and alkali solubility but also excellent coating properties have not been proposed in the art.

Accordingly, it is an object of the present invention to provide a photosensitive resin composition which enables the content of alkali-soluble groups and radically polymerizable groups, such as (meth)acryloyl groups, to be regulated and at the same time possesses excellent curability, alkali solubility, and coating properties, and a color filter which can be produced by a simple process, has excellent flatness, and can realize highly reliable color liquid-crystal displays having excellent display quality.

SUMMARY OF THE INVENTION

According to one aspect of the present invention, there is provided a photosensitive resin composition comprising: a copolymer resin; a bifunctional or higher polyfunctional photopolymerizable acrylate monomer; an epoxy resin; and an initiator, said copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, said copolymer resin containing 5 to 95% by mole of (meth)acryloyl groups and having an acid value of 5 to 400 mg KOH/g and a weight average molecular weight of 10,000 to 1,000,000 as determined using polystyrene as a standard:

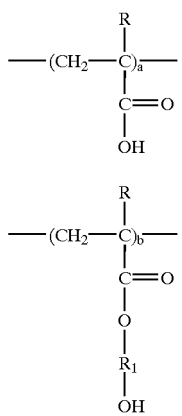

(1)

(2)

wherein R represents hydrogen or an alkyl group having 1 to 5 carbon atoms and $R_1$ represents an alkylene group having 2 to 4 carbon atoms.

According to another aspect of the present invention, there is provided a color filter comprising: a transparent substrate; a colored layer provided on the transparent substrate; and a protective layer provided so as to cover the colored layer, said protective layer having been formed by coating a photosensitive resin composition, exposing the coating, developing the exposed coating with an alkali, and heating the developed coating, said photosensitive resin composition comprising: a copolymer resin; a bifunctional or higher polyfunctional photopolymerizable acrylate monomer; an epoxy resin; and an initiator, said copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth) acryloylalkyl isocyanate compound, the constituent units represented by formula (2) having been partially reacted, through hydroxyl groups thereof, with a (meth) acryloylalkyl isocyanate compound, said copolymer resin containing 5 to 95% by mole of (meth)acryloyl groups and having an acid value of 5 to 400 mg KOH/g and a weight average molecular weight of 10,000 to 1,000,000 as determined using polystyrene as a standard.

According to a preferred embodiment of the present invention, the copolymer resin in the photosensitive resin composition and the color filter further comprises 0 to 75% by mole of constituent units represented by formula (3) and 0 to 75% by mole of constituent units represented by formula (4):

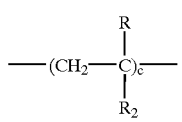

(3)

-continued

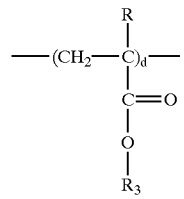

(4)

wherein R represents hydrogen or an alkyl group having 1 to 5 carbon atoms, $R_2$ represents an aromatic carbon ring, and $R_3$ represents an alkyl group or an aralkyl group.

The photosensitive resin composition of the present invention, by virtue of use of a copolymer resin having controlled alkali solubility, and curability, possesses excellent tackiness, leveling, alkali resistance, adhesion, developability, edge shape, surface appearance, and dynamic hardness. Use of this photosensitive resin composition in the formation of a protective layer can realize a color filter which can be easily produced and has excellent flatness and display quality and high reliability.

DESCRIPTION OF THE PREFERRED EMBODIMENTS

Figure 1:
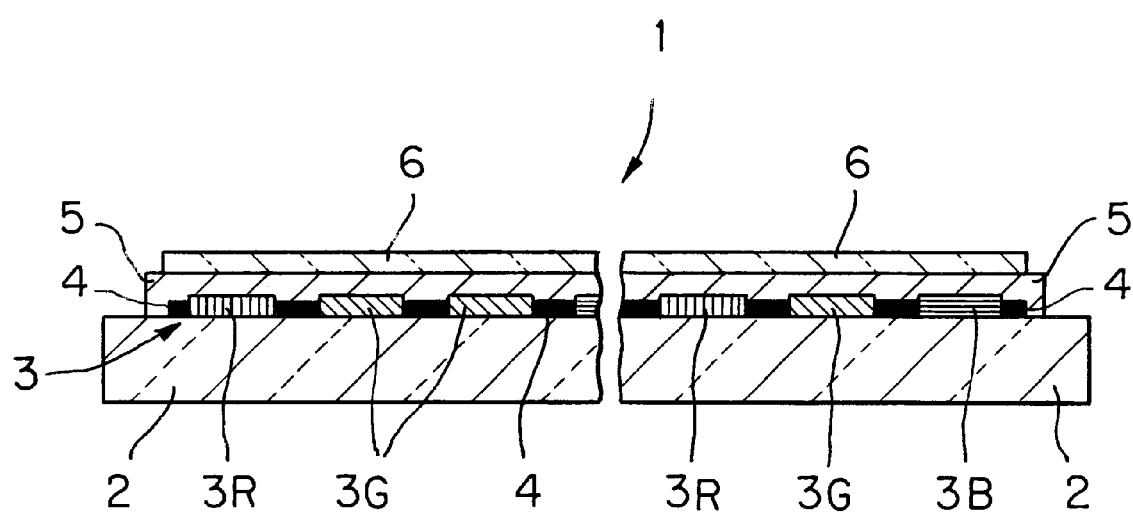
FIG. 1 is a schematic diagram showing the construction of one embodiment of the color filter according to the present invention.

The photosensitive resin composition of the present invention comprises a specific copolymer resin, a bifunctional or higher polyfunctional photopolymerizable acrylate monomer, an epoxy resin, and an initiator.

The specific copolymer resin in the photosensitive resin composition will be described. As described below, the copolymer resin basically contains constituents units comprising (meth)acryloyl groups introduced into constituent units represented by formula (1) and constituent units comprising (meth)acryloyl groups introduced into constituent units represented by formula (2). If necessary, the copolymer resin may further contain constituent units represented by formula (3) and constituent units represented by formula (4). As used herein, the term "(meth)acryloyl group" used herein refers to a methacryloyl group or an acryloyl group, and the term "(meth)acrylic acid" refers to methacrylic acid or acrylic acid.

In formulae (1) to (4), R represents hydrogen or an alkyl group having 1 to 5 carbon atoms. Examples of alkyl groups usable herein include methyl, ethyl, n-propyl, isopropyl, n-butyl, isobutyl, sec-butyl, tert-butyl, and n-pentyl groups.

The constituent units represented by formula (1) contribute to alkali developability. Monomers usable for introducing the constituent units represented by formula (1) include, for example, acrylic acid, methacrylic acid, 2-carboxy-1-butene, 2-carboxy-1-pentene, 2-carboxy-1-hexene, and 2-carboxy-1-heptene. The content of the constituent units represented by formula (1) is regulated according to the level of solubility required of the copolymer resin and is generally 5 to 55% by mole, preferably 10 to 25% by mole.

The constituent units represented by formula (2) are basically those in which (meth)acryloyl groups are introduced. Examples of $R_1$ include ethylene, propylene, and butylene groups. Monomers usable for introducing the constituent units represented by formula (2) include 2-hydroxyethyl acrylate, 2-hydroxyethyl methacrylate, 2-hydroxypropyl acrylate, 2-hydroxypropyl methacrylate, 4-hydroxybutyl acrylate, and 4-hydroxybutyl methacrylate. The constituent units represented by formula (2) have been partially reacted through hydroxyl groups thereof with the (meth)acryloylalkyl isocyanate compound to introduce (meth)acryloyl groups therein. The content of the constituent units represented by formula (2) is regulated according to the level of photopolymerizability required of the copolymer resin and is generally 5 to 95% by mole, preferably 10 to 50% by mole.

The constituent units represented by formula (3), when the copolymer resin according to the present invention is used in the formation of a coating, such as a protective layer of a color filter, function to impart coatability to the copolymer resin.

Examples of $R_2$ usable herein include aromatic rings such as phenyl and naphthyl groups. Monomers usable for introducing the constituent units represented by formula (3) include styrene and α-methylstyrene. The aromatic ring may be substituted by a halogen atom, such as chlorine or bromine, an alkyl group, such as a methyl or ethyl group, an amino group, such as an amino or dialkylamino group, a cyano group, a carboxyl group, a sulfonic acid group, phosphoric acid group or the like. The content of the constituent units represented by formula (3) is 0 to 75% by mole, preferably 5 to 50% by mole.

The constituent units represented by formula (4), when the copolymer resin is used in the formation of an alkali-developable protective layer for a color filter, inhibit alkali development. Examples of $R_3$ usable herein include alkyl groups having 1 to 12 carbon atoms and aralkyl groups, such as benzyl and phenylethyl groups. Monomers usable for introducing the constituent units represented by formula (4) include (meth)acrylic esters, such as methyl (meth)acrylate, ethyl (meth)acrylate, butyl (meth)acrylate, 2-ethylhexyl (meth)acrylate, phenyl (meth)acrylate, cyclohexyl (meth)acrylate, dicyclopentanyl (meth)acrylate, dicyclopentanyloxyethyl (meth)acrylate, isobornyl (meth)acrylate, benzyl (meth)acrylate, and phenylethyl (meth)acrylate. The content of the constituent units represented by formula (4) is 0 to 75% by mole, preferably 5 to 50% by mole.

For the introduction of the constituent units represented by formulae (1) to (4), the monomers exemplified above respectively for these constituent units may be used alone or as a mixture of two or more.

Preferred polymerization solvents usable for the production of a specific polymer comprising constituent units represented by formulae (1) to (4) include solvents free from active hydrogen, such as hydroxyl and amino groups. Examples thereof include: ethers, such as tetrahydrofuran; glycol ethers, such as diethylene glycol dimethyl ether, diethylene glycol diethyl ether, diethylene glycol methyl ethyl ether; cellosolve esters, such as methyl cellosolve acetate; propylene glycol monomethyl ether acetate; and 3-methoxybutyl acetate. Aromatic hydrocarbons, ketones, and esters are also usable.

Polymerization initiators commonly known as radical polymerization initiators may be used. Specific examples thereof include: azo compounds, such as 2,2'-azobisisobutylonitrile, 2,2'-azobis-(2,4-dimethylvaleronitrile), 2,2'-azobis-(4-methoxy-2,4-dimethylvaleronitrile); organic peroxides, such as benzoyl peroxide, lauroyl peroxide, tert-butyl peroxypivalate, and 1,'-bis-(tert-butylperoxy) cyclohexane; and hydrogen peroxide. When a peroxide is used as the radical polymerization initiator, the peroxide may be used in combination with a reducing agent for use as a redox type polymerization initiator.

In the production of a specific polymer comprising constituent units represented by formulae (1) to (4), molecular weight modifiers may be used to modify the weight average molecular weight. Examples of molecular weight modifiers usable herein include: halogenated hydrocarbons, such as chloroform and carbon tetrabromide; marcaptans, such as n-hexylmercaptan, n-octylmercaptan, n-dodecylmercaptan, tert-dodecylmercaptan, and thioglycol; xanthogens, such as dimethylxanthogen disulfide and diisopropylxanthogen disulfide; terpinolene; and α-methylstyrene dimer.

The specific polymer comprising constituent units represented by formulae (1) to (4) may be a random or block copolymer of monomers for the constituent units represented by formulae (1) to (4).

The random copolymer may be produced by adding dropwise a composition comprising monomers and a catalyst to a polymerizer containing a solvent at a temperature of 80 to 110° C. over a period of 2 to 5 hr, followed by ripening.

The specific polymer comprising the constituent units represented by formulae (1) to (4) has a weight average molecular weight, as determined using polystyrene as the standard (hereinafter referred to simply as "weight average molecular weight" or "Mw"), in the range of 10,000 to 1,000,000, an acid value of 5 to 400 mg KOH/g, and a hydroxyl value of 5 to 400 mg KOH/g.

The copolymer resin according to the present invention is obtained by reacting the specific polymer comprising constituent units represented by formulae (1) to (4) with a (meth)acryloyl-containing isocyanate compound.

The (meth)acryloylalkyl isocyanate compounds usable herein is one wherein a (meth)acryloyl group is bonded to an isocyanate group (—NCO) through an alkylene group having 2 to 6 carbon atoms. Specific examples thereof include 2-acryloylethyl isocyanate and 2-methacryloylethyl isocyanate. 2-Methacryloylethyl isocyanate is commercially available from Showa Denko K.K. under the designation of "Karenz MOI" and the like.

The reaction of the copolymer comprising the constituent units represented by formulae (1) to (4) with the (meth)acryloylalkyl isocyanate compound may be carried out by adding dropwise the isocyanate compound to a solution of the copolymer in the presence of a minor amount of a catalyst. Catalysts usable herein include dibutyltin laurate. In the reaction, polymerization inhibitors, such as p-methoxyphenol, hydroquinone, naphthylamine, tert-butyl catechol, and 2,3-di-tert-butyl p-cresol, may be used according to need.

The (meth)acryloylalkyl isocyanate compound is added and bonded to the constituent units represented by formula (2) in the specific polymer comprising the constituent units represented by formulae (1) to (4) through a urethane bond, and bonded to a part of the constituent units represented by formula (1) in the specific copolymer through an amido bond with evolution of carbon dioxide gas.

Specifically, the reaction product between the copolymer comprising the constituent units represented by formulae (1) and (2) and the (meth)acryloylalkyl isocyanate compound is represented by formula (5):

(5)

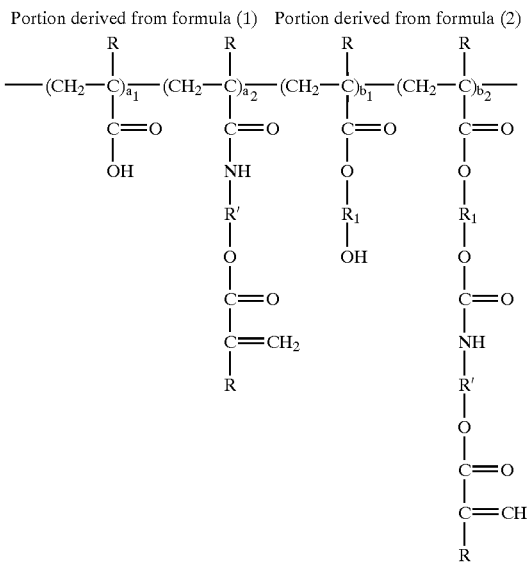

Portion derived from formula (1)   Portion derived from formula (2)

wherein R and $R_1$ each are as defined above in connection with formulae (1) to (4), R' represents an alkylene group having 2 to 6 carbon atoms, $a_1+a_2$ is a defined in formula (1), and $b_1+b_2$ is b defined in formula (2).

The rate of the reaction of the (meth)acryloylalkyl isocyanate compound with hydroxyl groups in the constituent units represented by formula (2) is about 20 times higher than that of the reaction of the (meth)acryloylalkyl isocyanate compound with carboxyl groups in the constituent units represented by formula (1). Therefore, the (meth) acryloyl group is mainly introduced into the constituent units represented by formula (2), and, in the constituent units represented by formula (1), most of the carboxyl groups remains unreacted even though the (meth)acryloyl group is introduced into a part of the carboxyl groups.

As described above, the copolymer resin comprises 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound. More specifically, in connection with formula 5, regarding the portion derived from formula (2), the proportion of units with an index $b_1$ in the copolymer resin may be 0 to 10% by mole, and the proportion of units with an index $b_2$ in the copolymer resin may be 5 to 95% by mole, provided that total of the proportion of units with an index $b_1$ and the proportion of units with an index $b_2$ is 5 to 95% by mole, while regarding the portion derived from formula (2), the proportion of units with an index $a_1$ in the copolymer resin may be 5 to 55% by mole, and the proportion of units with an index $a_2$ in the copolymer resin may be 0 to 10% by mole, provided that total of the proportion of units with an index $a_1$ and the proportion of units with an index $a_2$ is 5 to 55% by mole. Thus, the amount of the (meth)acryloyl group introduced can be regulated.

The weight average molecular weight of the copolymer resin according to the present invention is generally 10,000 to 1,000,000, preferably 20,000 to 100,000, from the viewpoint of suitability for use in the formation of a protective layer for a color filter and, in addition, of alkali solubility and photocurability. When the weight average molecular weight is smaller than 10,000, the developability is excessively good. This makes it difficult to control pattern shapes at the time of pattern-wise exposure. Even though patterns could be formed, a problem occurs such as a reduction in final coating thickness. On the other hand, when the weight average molecular weight exceeds 1,000,000, the viscosity of the copolymer resin in the form of a resist is so high that the coatability is lowered. Further, in this case, the developability is deteriorated. This makes it difficult to form sharp patterns.

The amount of the (meth)acryloyl group introduced is generally 5 to 95% by mole, preferably 10 to 50% by mole. When the amount is less than 5% by mole, the photocurability is low and the effect of improving coating adhesion and resist properties is small.

The acid value of the copolymer resin is generally 5 to 400 mg KOH/g, preferably 10 to 200 mg KOH/g. The acid value correlates with the alkali developability. Specifically, an acid value below the lower limit of the above range leads to problems such as poor developability and poor adhesion to the substrate and the color filter resin. On the other hand, an acid value above the upper limit of the above range provides excessively good developability, posing problems including the difficulty of regulating pattern shapes at the time of pattern-wise exposure. In the copolymer resin, the hydroxyl group in the constituent units represented by formula (2) is not always required to be left, and the hydroxyl value may be 0 to 200 mg KOH/g. However, the hydroxyl group may be left to effectively regulate the solubility of the copolymer resin in the solvent.

Copolymer resins suitable for the present invention will be exemplified. For all the copolymer resins exemplified below, the constituent units represented by formula (1) are derived from 2-hydroxyethyl methacrylate (HEMA) as a monomer, and the constituent units represented by formula (2) are derived from acrylic acid (AA). Further, the constituent units represented by formula (1) have been partially reacted, through carboxyl groups thereof, with 2-methacryloylethyl isocyanate (Karenz MOI, manufactured by Showa Denko K.K.), and the constituent units represented by formula (2) have been partially reacted, through hydroxyl groups thereof, with 2-methacryloylethyl isocyanate (Karenz MOI, manufactured by Showa Denko K.K.). The constituent units represented by formula (3) are derived from styrene (St) as the monomer, and the constituent units represented by formula (4) are derived from benzyl methacrylate (BzMA) as the monomer.

For the copolymer resins, the chemical composition (% by mole) is shown in Table 1, and the acryloyl group content (% by mole), the acid value (mg KOH/g), and the weight average molecular weight (Mw) as determined using polystyrene as the standard are shown in Table 2.

TABLE 1

| Copolymer resin No. | HEMA | AA | St | BzMA |
|---|---|---|---|---|
| (1) | 18 | 30 | 37 | 15 |
| (2) | 20 | 20 | 35 | 25 |
| (3) | 18 | 30 | 52 | 0 |
| (4) | 18 | 30 | 0 | 52 |

TABLE 2

| Copolymer resin No. | Mw | Content of acryloyl group | Acid value |
|---|---|---|---|
| (1) | 45,000 | 17.0 | 120 |
| (2) | 45,000 | 14.5 | 100 |
| (3) | 45,000 | 14.5 | 120 |
| (4) | 45,000 | 14.5 | 120 |

The content of the copolymer resin in the photosensitive resin composition according to the present invention is generally in an amount of 5 to 80% by weight, preferably 10 to 50% by weight, on a solid basis. When the content of the copolymer is more than 80% by weight, the viscosity of the composition is excessively high, leading to lowered fluidity. This poses a problem of coatability. On the other hand, when the content of the copolymer is less than 5% by weight, the viscosity of the composition is excessively low, leading to unsatisfactory stability of a coating of the composition after coating and drying. This poses problems such as deteriorated suitability for exposure and development.

Bifunctional or higher polyfunctional polymerizable acrylate monomers usable herein include ethylene oxide (3 mol) adducts, ethylene oxide (6 mol) adducts, propylene oxide (3 mol) adducts, and propyleneoxide (6mol) adducts of dipentaerythritol hexaacrylate (DPHA), dipentaerythritol pentaacrylate (DPPA), pentaerythritol triacrylate (PETTA), trimethylolpropane triacrylate (TMPTA), and trimethylolpropane triacrylate (TMPTA).

The content of the bifunctional or higher polyfunctional polymerizable acrylate monomer in the photosensitive resin composition is generally 3 to 50% by weight, preferably 5 to 20% by weight, on a solid basis. When the bifunctional or higher polyfunctional polymerizable acrylate monomer content is more than 50% by weight, the viscosity of the composition is excessively low, leading to unsatisfactory stability of a coating of the composition after coating and drying. This poses problems such as deteriorated suitability for exposure and development. On the other hand, a bifunctional or higher polyfunctional polymerizable acrylate monomer content of less than 3% by weight poses a problem that unexposed proportions cannot be fully removed.

The epoxy resin functions to react with unreacted acid groups present after exposure and development, thereby imparting alkali resistance to the protective layer. Epoxy resins usable herein include o-cresol novolak type, bisphenol A novolak type, phenol novolak type, and bisphenol A type epoxy resins, and cresol novolak type epoxy resins. The content of the epoxy resin in the photosensitive resin composition is generally 1 to 20% by weight, preferably 3 to 15% by weight, on a solid basis. When the epoxy resin content is less than 1% by weight, satisfactory alkali resistance cannot be imparted to the protective layer. On the other hand, when the epoxy resin content is more than 20% by weight, the amount of the epoxy resin not involved in photocuring is excessively large. This unfavorably results in deteriorated storage stability and suitability for development of the photosensitive resin composition. Further, the epoxy resin is effective in removing the tack of the dried coating of the photosensitive resin composition. The addition of the epoxy resin in an amount of about 3% by weight suffices for attaining this effect. According to the present invention, upon heat treatment, the epoxy resin contained in the photosensitive resin composition is reacted with acid groups remaining in the protective layer without undergoing the reaction after the exposure and the alkali development to impart excellent alkali resistance to the protective layer.

Initiators usable herein include 2-methyl-1-[(4-methylthio)phenyl]-2-morpholinopropanone-1,2-benzyl-2-dimethylamino-1-(4-morpholinophenyl)-butanone-1,2,2'-bis(o-chlorophenyl)-4,5,4',5'-tetraphenyl-1,2'-biimidazole, 2,4-diethylthioxanthone, and 4,4-bisdiethylaminobenzophenone. The content of the initiator in the photosensitive resin composition is preferably 0.1 to 20% by weight, on a solid basis.

Silane coupling agents may be added to improve the adhesion of the color filter layer to the substrate glass. Silane coupling agents usable herein include vinylsilane, acrylsilane, epoxysilane, and aminosilane. More specifically, examples of vinylsilanes usable herein include vinyltrichlorosilane, vinyltris(β-methoxyethoxy)silane, vinyltriethoxysilane, and vinyltrimethoxysilane. Examples of acrylsilanes usable herein include γ-methacryloxypropyltrimethoxysilane, and γ-methacryloxypropylmethyldimethoxysilane. Examples of epoxysilanes usable herein include β-(3,4-epoxycyclohexyl) ethyltrimethoxysilane, γ-glycidoxypropyltrimethoxysilane, and γ-glycidoxypropylmethyldiethoxysilane. Examples of aminosilanes usable herein include N-β-(aminoethyl)-γ-aminopropyltrimethoxysilane, N-β-(aminoethyl)-γ-aminopropylmethylditrimethoxysilane, γ-aminopropyltriethoxysilane, and N-phenyl-γ-aminopropyltrimethoxysilane. Examples of other silane coupling agents usable herein include γ-mercaptopropyltrimethoxysilane, γ-chloropropyltrimethoxysilane, γ-chloropropylmethyldimethoxysilane, γ-chloropropylmethyldimethoxysiliane, and γ-chloropropylmethyldiethoxysilane.

According to the photosensitive resin composition of the present invention, diethylene glycol dimethyl ether, 3-methoxybutyl acetate, propylene glycol monomethyl ether acetate, and 3-methyl-3-methoxybutanol may be used as a solvents to give a concentration of 5 to 50% by weight on a solid basis.

According to the photosensitive resin composition of the present invention, use of the copolymer resin having controlled alkali solubility and curability in the protective layer can offer excellent tackiness, leveling, alkali resistance, adhesion, developability, edge shapes, appearance, dynamic hardness and other properties.

Next, the color filter of the present invention will be described.

FIG. 1 is a schematic diagram showing the construction of one embodiment of the color filter according to the present invention. In FIG. 1, a color filter 1 according to the present invention comprises: a transparent substrate 2; a colored layer 3 and a black matrix 4 each having a predetermined pattern provided on the transparent substrate 2; a protective layer 5 provided so as to cover the colored layer 3; and a transparent electrode 6 provided on the protective layer 5, for liquid-crystal drive.

In the color filter 1, nonflexible rigid materials, such as quartz glass, Pyrex glass, and synthetic quartz plates, or flexible materials, such as transparent resin films and resin plates for optical purposes, may be used for constituting the transparent substrate 2. Among them, Glass 7059 manufactured by Corning has a low coefficient of thermal expansion, has excellent dimensional stability and workability in heat treatment at high temperatures, and, because of an alkali-free glass, is particularly suitable for color filters used in color liquid-crystal displays.

The colored layer 3 in the color filter 1 has a red pattern 3R, a green pattern 3G, and a blue pattern 3B arranged in a desired form such as mosaic, stripe, triangular, or four-pixel placement. The black matrix 4 is provided between adjacent color patterns and the outside of the colored layer 3 forming region in its predetermined portion.

The colored layer 3 may be formed by any method, for example, a dyeing method which comprises coating a dyeing substrate, exposing the dyeing substrate through a photomask, developing the exposed dyeing substrate to form a pattern, and dyeing the pattern, a pigment dispersion method which comprises previously dispersing a color pigment in a photosensitive resist, exposing the resist through a photomask, and developing the exposed resist, a printing method wherein each color is printed using printing inks, or an electrodeposition method which comprises previously forming a transparent conductive layer on a transparent substrate, forming a positive-working resist layer on the transparent conductive layer, exposing the resist layer through a photomask, developing the exposed resist layer to expose predetermined portions of the transparent conductive layer, immersing the transparent substrate in an electrodeposition liquid, and, in this state, energizing the transparent conductive layer to perform electrodeposition, thereby forming a colored layer.

The black matrix 4 also may be formed by any one of the dyeing method, pigment dispersion method, printing method, and electrodeposition method. Further, chromium vapor deposition or the like may be used for the formation of the black matrix 4.

The protective layer may be formed by coating the photosensitive resin composition of the present invention onto the transparent substrate, with the colored layer and the black matrix formed thereon, by spin coating, roller coating, spray coating, printing or the like to a thickness of 0.5 to 20 μm, preferably 1 to 8 μm, on a dry basis, exposing the coating through a predetermined photomask, and developing the exposed coating. When spin coating is used, the number of revolutions of the spin coater is preferably 500 to 1500 rpm.

The exposure is carried out by applying ultraviolet light through a photomask. After the exposure, alkali development is carried out, followed by heat treatment (post-baking). Thus, the protective layer is formed. The protective layer 5 has a film strength of not less than 4 in terms of pencil hardness after immersion of the protective layer in an 1% aqueous sodium hydroxide solution (solution temperature=25° C.) for 24 hr. Further, after the immersion in the alkali solution, the protective layer is not separated. That is, the protective layer 5 has very high alkali resistance.

After the exposure and the alkali development, unreacted acid groups are present in the photosensitive resin composition. According to the present invention, however, since the epoxy resin contained in the photosensitive resin composition is reacted with the residual acid groups upon heat treatment, any acid group reactive with an alkali is absent in the formed protective layer. Therefore, the protective layer has excellent alkali resistance.

Heat treatment (post-baking) after the completion of the exposure of the coating of the photosensitive composition and the alkali development may be generally carried out under conditions of 120 to 250° C. and about 5 to 90 min. This heat treatment permits the epoxy resin contained in the photosensitive resin composition to be reacted with the remaining acid groups.

The transparent electrode may be provided on the protective layer by a conventional film forming method, such as sputtering, vacuum deposition, or CVD, using indium tin oxide (ITO), zinc oxide (ZnO), tin oxide (SnO), or an alloy thereof and optionally performing etching using a photoresist to form a predetermined pattern. The thickness of the transparent electrode is about 20 to 500 nm, preferably about 100 to 300 nm.

The following examples further illustrate the present invention, but are not intended to limit it.

(Synthesis of Copolymer Resin (1))

The following composition was provided.

Benzyl methacrylate . . . 264 g (15 mol %)
Styrene . . . 385 g (37 mol %)
Acrylic acid . . . 216 g (30 mol %)
2-Hydroxyethyl methacrylate . . . 234 g (18 mol %)

This composition, together with 5 g of azobisisobutyronitrile, was dissolved in 650 g of 3-methoxybutyl acetate. The solution was then added dropwise to a polymerizer containing 1000 g of 3-methoxybutyl acetate at 100° C. over a period of 6 hr. Thus, polymerization was carried out to prepare a polymer solution.

The polymer solution had a solid content of 40% by weight and a viscosity of 1050 mPa·s (30° C., Brookfield viscometer). The polymer had an acid value of 152 mg KOH/g, a hydroxyl value of 90 mg KOH/g, and a weight average molecular weight of 37,000 as determined using polystyrene as a standard.

The copolymer thus obtained comprised 15% by mole of styrene units, 37% by mole of benzyl methacrylate units, 30% by mole of acrylic acid units, and 18% by mole of 2-hydroxyethyl methacrylate units.

A mixture having the following composition was added dropwise to the polymer solution over a period of 5 hr.

2-Methacryloylethyl isocyanate . . . 270 g
Dibutyltin laurate . . . 1 g
3-Methoxybutyl acetate . . . 2230 g The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 26% by weight and a viscosity of 500 mPa·s (30° C., Brookfield viscometer). The polymer had an acid value of 120 mg KOH/g, a hydroxyl value of 5 mg KOH/g, and a weight average molecular weight of 45,000 as determined using polystyrene as a standard and contained 17% by mole of (meth)acryloyl groups.

(Synthesis of Copolymer Resin (2))

The following composition was provided.

Styrene . . . 540 g (52 mol %)
Acrylic acid . . . 216 g (30 mol %)
2-Hydroxyethyl methacrylate . . . 234 g (18 mol %)

This composition, together with 5 g of azobisisobutyronitrile, was dissolved in 650 g of 3-methoxybutyl acetate. The solution was then added dropwise to a polymerizer containing 1000 g of 3-methoxybutyl acetate at 100° C. over a period of 6 hr. Thus, polymerization was carried out to prepare a polymer solution.

The polymer solution had a solid content of 40% by weight and a viscosity of 950 mPa·s (30° C., Brookfield viscometer). The polymer had an acid value of 150 mg KOH/g, a hydroxyl value of 90 mg KOH/g, and a weight average molecular weight of 38,000 as determined using polystyrene as a standard.

The copolymer thus obtained comprised 52% by mole of styrene units, 30% by mole of acrylic acid units, and 18% by mole of 2-hydroxyethyl methacrylate units.

A mixture having the following composition was added dropwise to the polymer solution over a period of 5 hr.

2-Methacryloylethyl isocyanate . . . 270 g
Dibutyltin laurate . . . 1 g
3-Methoxybutyl acetate . . . 2230 g The progress of the reaction was monitored by IR (an infrared absorption spectrum), and the reaction was continued until the peak attributable to the isocyanate group at 2200 cm$^{-1}$ had disappeared.

The reaction solution thus obtained had a solid content of 25% by weight and a viscosity of 490 mPa.s (30° C., Brookfield viscometer). The polymer had an acid value of 120 mg KOH/g, a hydroxyl value of 5 mg KOH/g, and a weight average molecular weight of 45,000 as determined using polystyrene as a standard and contained 14.5% by mole of (meth)acryloyl groups.

EXAMPLE 1

A red photosensitive resin having the following composition was spin coated on a 1.1 mm-thick glass substrate (AL material, manufactured by Asahi Glass Co., Ltd.) to a coating thickness of 1.5 μm. The coated substrate was dried for 30 min in an oven of 70° C. Next, The coated surface was exposed to light from a mercury lamp through a photomask having a predetermined pattern, followed by spray development with water for one min to form a red relief pattern in regions where red pixels are to be formed. Thereafter, curing treatment was carried out at 150° C. for 30 min.

Next, the same procedure as used in the formation of the red relief pattern was repeated, except that a green photosensitive resin having the following composition was used. Thus, a green relief pattern was formed in regions where green pixels are to be formed.

The same procedure as used in the formation of the red relief pattern was then repeated, except that a blue photosensitive resin having the following composition was used. Thus, a blue relief pattern was formed in regions where blue pixels are to be formed. Thus, colored layers of three colors, red (R), green (G), and blue (B) were prepared.
(Composition of Red Photosensitive Resin)
   Pyrazolone Red (red pigment) . . . 10 pts.wt.
   Polyvinyl alcohol/5% stilbazolium
   quinolium (photosensitive resin) . . . 5 pts.wt.
   Water . . . 85 pts.wt.
(Composition of Green Photosensitive Resin)
   Lionol Green 2Y-301 (green pigment) . . . 9 pts.wt.
   Polyvinyl alcohol/5% stilbazolium
   quinolium (photosensitive resin) . . . 5 pts.wt.
   Water . . . 86 pts.wt.
(Composition of Blue Photosensitive Resin)
   Fastogen Blue (blue pigment) . . . 3 pts.wt.
   Polyvinyl alcohol/5% stilbazolium
   quinolium (photosensitive resin) . . . 5 pts.wt.
   Water . . . 92 pts.wt.

A photosensitive resin composition prepared by the following method was spin coated onto the glass substrate, with the colored layers formed thereon, to a coating thickness of 1.2 μm on a dry basis.
(Preparation of Photosensitive Resin Composition)
   The following compounds were provided.
   Copolymer Resin (1)
   (solid content 26 wt %) . . . 46.8 pts.wt.
   Dipentaerythritol Pentaacrylate
   (SR 399, manufactured by Sartomer) . . . 9.1 pts.wt.
   o-Cresol Novolak Type Epoxy Resin
   (Epikote 180S70, manufactured by Yuka Shell Epoxy K.K.) . . . 5.2 pts.wt.
   2-Methyl-1-[(4-methylthio)phenyl]-2-morpholinopropanone-1 . . . 1.8 pts.wt.
   2,2'-Bis(o-chlorophenyl)-4,5,4',5'-tetraphenyl-1,2'-biimidazole . . . 1.3 pts.wt.
   Diethylene glycol dimethyl ether . . . 29.6 pts.wt.
   3-Methoxybutyl acetate . . . 6.2 pts.wt.
They were mixed together at room temperature with stirring to prepare the photosensitive resin composition of the present invention.
(Step of Exposure and Development)

A photomask was disposed at a position 100 μm distant from the coating of the photosensitive resin composition. Ultraviolet light was applied by a proximity aligner from a 2.0 kW ultrahigh-pressure mercury lamp for 10 sec only to regions corresponding to colored layer-forming regions. The exposed assembly was then immersed in a 0.05% aqueous potassium hydroxide solution (liquid temperature 23° C.) for one min to perform alkali development. Thus, only uncured portions in the coating of the photosensitive resin composition were removed.

Thereafter, the assembly was allowed to stand in an atmosphere of 180° C. for 30 min to perform heat treatment, thereby forming a protective layer. Thus, a color filter of the present invention was obtained.

EXAMPLE 2

A color filter was prepared in the same manner as in Example 1, except that the following photosensitive resin composition was used instead of the photosensitive resin composition in Example 1.
(Preparation of Photosensitive Resin Composition)
   The following compounds were provided.
   Copolymer Resin (2)
   (solid content 25 wt %) . . . 46.8 pts.wt.
   Dipentaerythritol Pentaacrylate
   (SR 399, manufactured by Sartomer) . . . 9.1 pts.wt.
   o-Cresol Novolak Type Epoxy Resin
   (Epikote 180S70, manufactured by Yuka Shell Epoxy K.K.) . . . 5.2 pts.wt.
   2-Methyl-1-[(4-methylthio)phenyl]-2-morpholinopropanone-1 . . . 1.8 pts.wt.
   2,2'-Bis(o-chlorophenyl)-4,5,4',5'-tetraphenyl-1,2'-biimidazole . . . 1.3 pts.wt.
   Diethylene glycol dimethyl ether . . . 29.6 pts.wt.
   3-Methoxybutyl acetate . . . 6.2 pts.wt.
They were mixed together at room temperature with stirring to prepare the photosensitive resin composition of the present invention.

COMPARATIVE EXAMPLE 1

A color filter was prepared in the same manner as in Example 1, except that the following photosensitive resin composition was used instead of the photosensitive resin composition in Example 1.
(Preparation of Photosensitive Resin Composition)
   The following compounds were provided.
   o-Cresol novolak epoxyacrylate
   (50% of hydroxyl groups having been reacted with phthalic anhydride) . . . 8.8 pts.wt.
   Dipentaerythritol hexaacrylate . . . 8.8 pts.wt.
   o-Cresol novolak type epoxy resin . . . 2.0 pts.wt.
   Initiator (Irgacure 369) . . . 0.4 pt.wt.
   3-Methoxybutyl acetate . . . 80 pts.wt.
They were mixed together with stirring to prepare a photosensitive resin composition.

The protective layer for each of the color filters thus obtained was evaluated under the following conditions for tackiness, leveling, alkali resistance, adhesion, developability, edge shape, surface appearance, and dynamic hardness.
(Alkali Resistance, Surface Appearance of Protective Layer, and Dynamic Hardness)

The sample was immersed in a 1% aqueous sodium hydroxide solution (liquid temperature 23° C.) for 24 hr, and then pulled up. The hardness of the protective layer was measured with a dynamic hardness meter (Shimadzu Dynamic Microhardness Meter DUH-201S, constant pushing load: triangular indenter: 115°, load: 5 mN, loading rate constant: 6, holding time: 5 sec). Further, the appearance was evaluated according to the following criteria.

Criteria for evaluation of appearance
- ○: No change in protective layer
- Δ: Occurrence of roughening and cells on the surface of the protective layer
- X: Separation of the protective layer in a part or entirety thereof (Developability, Edge Shape)

The sample was immersed in a 0.05% aqueous potassium hydroxide solution (23° C.) for one min to completely remove the non-exposed regions. In this case, the shape of peripheral portions of the protective layer pattern was evaluated according to the following criteria.
- ○: The peripheral portions are linear, and are free from waviness, wrinkles and other unfavorable detects.
- X: The peripheral portions are not linear, and have waviness, wrinkles or other unfavorable detects.

(Tackiness)

The surface after exposure and development was visually inspected for the tackiness, and the results were evaluated according to the following criteria.
- ○: Not tacky
- X: Tacky (Leveling)

After coating and drying, the surface state was visually inspected. The flatness was evaluated according to the following criteria.
- ○: Flat surface
- X: Lack in flatness, and orange-peel surface (Adhesion)

The protective layer was crosscut, followed by a peel test using a pressure-sensitive adhesive tape (No. 610, manufactured by 3M). The results were evaluated according to the following criteria.
- ○: Square protective layers not separated
- X: Square protective layers separated The results are shown in Table 3.

TABLE 3

|  | Ex. 1 | Ex. 2 | Comp. Ex. 1 |
| --- | --- | --- | --- |
| Alkali resistance |  |  |  |
| Surface appearance | ○ | ○ | X |
| Dynamic hardness | 45 | 46 | 35 |
| Developability, edge shape | ○ | ○ | X |
| Tackiness | ○ | ○ | X |
| Leveling | ○ | ○ | ○ |
| Adhesion | ○ | ○ | ○ |

What is claimed is:

1. A photosensitive resin composition comprising:
a copolymer resin; a bifunctional or higher polyfunctional photopolymerizable acrylate monomer; an epoxy resin; and an initiator,
said copolymer resin comprising 5 to 55% by mole of constituent units represented by formula (1) and 5 to 95% by mole of constituent units represented by formula (2), the constituent units represented by formula (1) having been partially reacted, through carboxyl groups thereof, with a (meth)acryloylalkyl isocyanate compound, the constituent units represented by formula (2) having been partially reacted, through hydroxyl groups thereof, with a (meth)acryloylalkyl isocyanate compound, said copolymer resin containing 5 to 95% by mole of (meth)acryloyl groups and having an acid value of 5 to 400 mg KOH/g and a weight average molecular weight of 10,000 to 1,000,000 as determined using polystyrene as a standard:

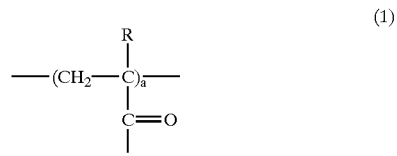

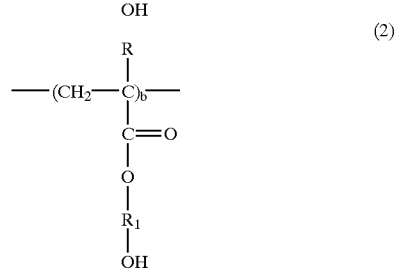

wherein R represents hydrogen or an alkyl group having 1 to 5 carbon atoms and $R_1$ represents an alkylene group having 2 to 4 carbon atoms, and 5 to 50% by mole of constituent units represented by formula (3) and 0 to 75% by mole of constituent units represented by formula (4):

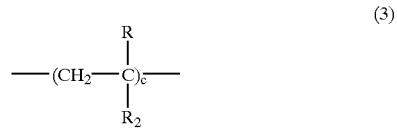

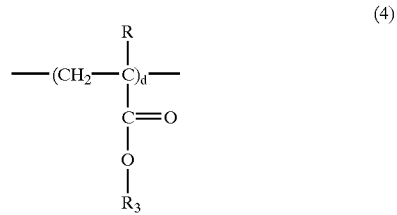

wherein R represents hydrogen or an alkyl group having 1 to 5 carbon atoms, $R_2$ represents an aromatic carbon ring, and $R_3$ represents an alkyl group or an aralkyl group.

2. The photosensitive resin composition according to claim 1, wherein the constituent groups represented by formula (4) are present in a quantity of 5 to 50% by mole.

* * * * *